United States Patent [19]
Kant

[11] 4,191,964
[45] Mar. 4, 1980

[54] HEADLESS RESISTOR

[75] Inventor: Rajni Kant, San Jose, Calif.

[73] Assignee: Fairchild Camera & Instrument Corp., Mountain View, Calif.

[21] Appl. No.: 914,637

[22] Filed: Jun. 12, 1978

Related U.S. Application Data

[63] Continuation of Ser. No. 760,593, Jan. 19, 1977, abandoned.

[51] Int. Cl.² ............................................. H01L 27/02
[52] U.S. Cl. ......................................... 357/51; 357/15; 357/20
[58] Field of Search ............................... 357/15, 51, 20

[56] References Cited

U.S. PATENT DOCUMENTS

| | | | |
|---|---|---|---|
| 3,615,932 | 10/1971 | Makimoto et al. | 357/51 |
| 3,683,306 | 8/1972 | Bulthuis et al. | 357/51 |
| 3,860,465 | 1/1975 | Matzner | 357/51 |
| 3,879,236 | 4/1975 | Langdon | 357/51 |

*Primary Examiner*—Joseph E. Clawson, Jr.
*Attorney, Agent, or Firm*—Alan H. MacPherson; Robert C. Colwell

[57] ABSTRACT

A diffused resistor included in a Schottky device formed in a planar semiconductor material comprises a resistor diffusion formed in the surface of the material and a contact diffusion formed in the surface of the material, the configuration of the contact diffusion being essentially coincident with the shape of the resistor at the location at which ohmic contact to the resistor diffusion is made.

5 Claims, 6 Drawing Figures

HEADLESS RESISTOR

This is a continuation of application Ser. No. 760,593, filed Jan. 19, 1977 now abandoned.

This invention relates to resistors in planar semiconductor technology and, more particularly, to a planar resistor in a Schottky device and having contact areas which are coincident with the shape of the resistor.

The gold doped TTL (transistor-transistor logic) process is an industry standard process which has been used to produce a wide range of products including arithmetic logic units, counters, memories, drivers, buffers and multiplexers and numerous other SSI (small-scale integration) products. Characteristically, in the gold doped TTL process metal is deposited at temperatures greater than 550° C. and the resistivity of epitaxial layers is less than 1 $\Omega$-cm. Due to the temperature and epitaxial resistivity, the deposited metal forms an ohmic contact rather than a diode.

In order to form a diffused resistor in the surface of a semiconductor device produced by the gold doped TTL process, it would typically be necessary to diffuse or implant a p-type material into an n-type epitaxial layer. Formation of the contacts to the resistor would be made on the surface of the semiconductor material at either end of the region dedicated to the resistor. Since metal makes an ohmic contact to the epitaxial layer, the metal deposited at either end of the resistor region to contact the resistor region could not be allowed to touch the epitaxial layer. If the metal contacted physically the epitaxial layer then a short would occur between the resistor and supply voltage, $V_{CC}$, and circuit performance would be impaired. Such physical contact could occur if a contact mask were misaligned or if an oversized contact opening were inadvertently formed by over-etching. In order to overcome this problem, buffer regions or "heads" were formed around the ends of the resistive regions. These "heads" surrounded the resistive regions at the point at which electrical contacts would be formed. The contacts could never overlap epitaxial regions and no short would occur. Such resistors are known to solve the shorting problem but result in larger areas of semiconductor material because the design rules for a given process allow components to be placed only at certain minimum distances from each other.

It is therefore an object of the present invention to provide a planar diffused resistor for a Schottky device which does not have a buffer region or "head" of highly doped conductivity surrounding the ends.

It is a further object of the present invention to provide a headless planar diffused resistor.

It is another object of the present invention to provide a planar diffused resistor on which the electrical contact regions are coincident with the shape of the resistor.

BRIEF DESCRIPTION OF THE DRAWINGS

For a more complete understanding of the headless diffused resistor of the present invention, reference may be made to the drawings which are incorporated by reference herein and in which.

SUMMARY OF THE INVENTION

In a TTL Schottky process characterized by metallization temperatures of less than 520° C. and epitaxial resistivities greater than 0.1 $\Omega$-cm, diffused resistors are provided with ends which do not have heavily doped regions surrounding contact areas. Shorts do not occur even if contacts are misaligned or if contact openings are oversized due to excessive exposure of the contact mask. Schottky diodes are formed in such instances instead of metal-to-epitaxy shorts.

BRIEF DESCRIPTION OF THE PREFERRED EMBODIMENT

Schottky processes are increasingly used to produce products such as memories, microprocessor circuits and various MSI (medium-scale integration) and SSI (small-scale integration) functions. This process is preferred primarily because of higher speed-power products and packing densities. In such processes in order to achieve high-level integration it is desired to produce diffused resistors. Such resistors are universally produced in epitaxial layers since the use of a bulk substrate for fabrication of active devices would require a triple diffusion. The triple diffusion would produce too high a surface impurity concentration to permit fabrication of Schottky devices. Thus, the double diffusion into a predoped epitaxial layer is employed.

The prior-art technique for production of diffused planar resistors in standard production processes including the gold doped TTL process was to provide highly doped contact regions in the semiconductor material surrounding the ends of the resistors so that misaligned or over-etched contact openings will not result in metal-to-epitaxy shorts. However, it has been found that for the special metal schemes and temperature characteristic of Schottky processes shorts do not occur but, instead, Schottky diodes are formed. The present invention in which headless diffused resistors are produced results from this discovery.

Figure 1:
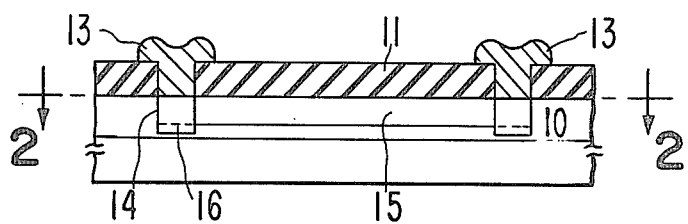
FIG. 1 is a cross-sectional view of the headless resistor of the present invention.
Figure 2:
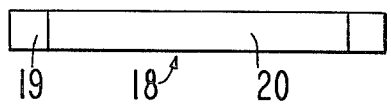
FIG. 2 is a plan view of FIG. 1 taken through lines 2—2.

FIGS. 1 and 2 illustrate the presently preferred embodiment of the diffused headless resistor of the present invention. A diffused region 15 has been formed in epitaxial layer 10. It extends into the contact diffusion 14 as shown by the horizontal dotted line. The impurity concentration will be determined by the optimum process. The configuration of region 15 will be determined by the resistance desired. Ohmic contact to region 15 is made by forming an opening in insulation layer 11, typically composed of silicon dioxide, and performing a contact diffusion which typically extends to the bottom of the resistor diffusion or below it as shown by region 16. This contact diffusion is frequently performed by the same step as the base diffusion of vertical bipolar transistors. This contact diffusion is not performed to offset resistance since the size of the resistor will determine the ultimate resistance but rather to provide a good medium for adherence of a metal contact since the presence of impurity atoms tends to produce a better bond.

Plugs of metal or polycrystalline silicon 13 are then deposited through windows opened in silicon dioxide 11 to connect diffused region 15 with other parts of the integrated circuit. In one example the resistor diffusion region 15 has a sheet resistance on the order of 1,000 Ω/square and the contact diffusion has a resistance on the order of 400 Ω/square. If metal plugs 13 should contact substrate or epitaxial layer 10 there will be no short because a Schottky diode is formed between metal and epitaxy and it is reverse-biased since the epitaxy surrounding resistor diffusion is invariably tied to the highest potential in the circuit, i.e., to the supply line.

Figure 5:
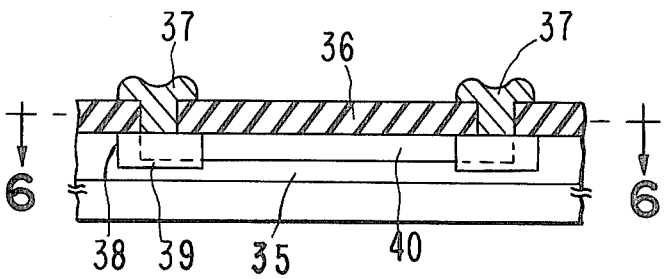
FIG. 5 is a cross-sectional view of a prior-art diffused planar resistor.
Figure 6:
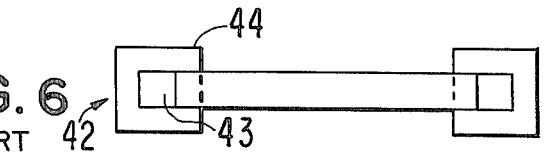
FIG. 6 is a plan view of the prior-art resistor of FIG. 5 taken through line 6—6.

A prior-art structure for non-Schottky devices is shown in FIGS. 5 and 6. The contact diffusion 38 (FIG. 5) has been expanded to a perimeter 44 (FIG. 6) so that the metal plug 37 will never touch the substrate or epitaxial layer 35. The contact area 43 is so completely surrounded by contact diffusion 38 that a metal-to-epitaxy contact would not likely occur. If it did occur a short would result because the resistivity of the epitaxial layer is lower than with Schottky processes and the temperature at which metal is applied is greater.

Figure 3:
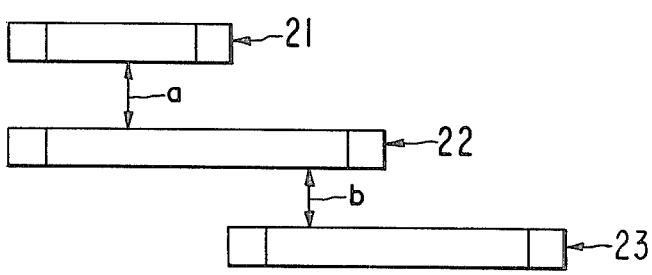
FIG. 3 is a plan view of a diffused resistor layout utilizing the headless resistors of FIG. 1.
Figure 4:
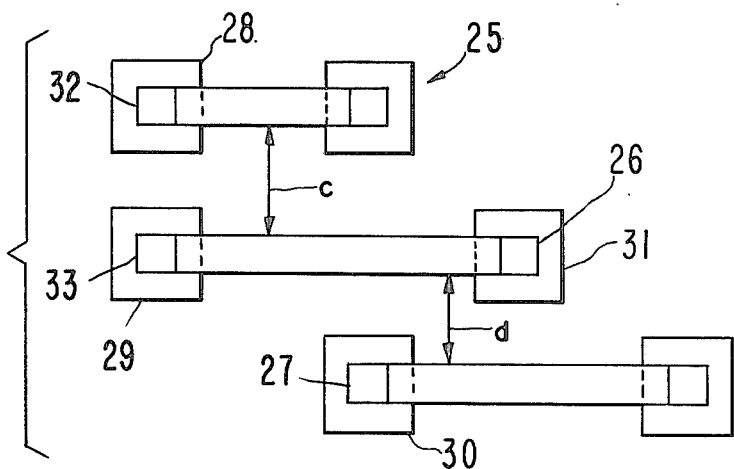
FIG. 4 is a plan view of a resistor layout using prior-art diffused resistors.

The utility of the headless resistor can clearly be seen by comparing the layout of FIG. 3 with that of FIG. 4. Design rules for any process will specify the minimum distance between adjacent components. These minimum distances are determined by mask alignment tolerance, etching tolerances, worst case depletion layer widths and channelling problems. With no "heads" to be concerned about, a circuit designer can place resistors in parallel with each other or with other active device regions at the minimum distance; in FIG. 3, then, spacings a and b can be minimum distance. However, when resistor heads are used the heads themselves must not be allowed to come closer than the minimum allowable distance to any other region. Thus, spacing d in FIG. 4 is this minimum allowable design distance plus twice the distance that the perimeter of heads 28 and 29 extend beyond the respective metal contact openings 32 and 33. And spacing d is this minimum allowance design distance plus the greater of the distances that the perimeters of heads 31 and 30 extend beyond the respective metal contact openings 26 and 27. Component layout can be more dense without resistor heads.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A diffused resistor formed in a body of semiconductor material, said semiconductor material having an impurity concentration of less than $10^{17}$ atoms per cubic centimeter and having an overlying insulating layer, said diffused resistor comprising:
    a resistor diffusion formed in said semiconductor body;
    two contact diffusions formed in non-adjacent portions of said resistor diffusion, the configuration of said contact diffusions being substantially coincident with the shape of said resistor diffusion and adjacent said body of semiconductor material at the locations at which each of the contacts is made, said contact diffusion of such concentration to form an ohmic contact to a Schottky contact forming material; and
    two ohmic contacts of a Schottky contact forming material for ohmically contacting each of said contact diffusions, each of said ohmic contacts being substantially coincident with the corresponding contact diffusion, said two ohmic contacts being substantially coincident with the corresponding contact diffusion, said two ohmic contacts being formed at a temperature of less than 520° C. to thereby form a Schottky diode between any portion of said ohmic contacts which is formed in contact with any portion of said semiconductor body.

2. The diffused resistor of claim 1 wherein said resistor diffusion is linearly disposed and said contact diffusions coincide, respectively, with the oppisite ends of said resistor diffusion.

3. The diffused resistor of claim 2 wherein said substrate comprises an epitaxial layer of silicon formed upon a bulk silicon substrate, the epitaxial layer is of n type conductivity with a resistivity between 0.1 and 1 Ω-cm, and resistor diffusion is of p type conductivity with a sheet resistivity of greater than 900 Ω/□, and said contact diffusion is of p+ type conductivity with a sheet resistance of less than 500 Ω/□.

4. The diffused resistor of claim 3 wherein said metal contacts are formed at a temperature of less than 520° C.

5. A diffused resistor formed in a body of semiconductor material, said semiconductor material having a resistivity greater than 0.1 ohm centimeter and having an overlying insulating layer, said diffused resistor comprising:
    a resistor diffusion formed in said semiconductor body;
    two contact diffusions formed in non-adjacent portions of said resistor diffusion, the configuration of said contact diffusions being substantially coincident with the shape of said resistor diffusion and adjacent said body of semiconductor material at the locations at which each of the contacts is made, said contact diffusion of such concentration to form an ohmic contact to a Schottky contact forming material; and
    two ohmic contacts of a Schottky contact forming material for ohmically contacting each of said contact diffusions, each of said ohmic contacts being substantially coincident with the corresponding contact diffusion, said two ohmic contacts being formed at a temperature of less than 520° C. to thereby form a Schottky diode between any portion of said ohmic contacts which is formed in contact with any portion of said semiconductor body.

* * * * *